United States Patent
Eda et al.

[11] Patent Number: 5,845,575
[45] Date of Patent: Dec. 8, 1998

[54] VARNISHING FILM AND METHOD OF ADJUSTING THE SURFACE GLOSS OF PREPRESS COLOR PROOF USING THE SAME

[75] Inventors: Toshikazu Eda; Toshihiko Takada; Kazuo Nagashima; Hisashi Nakajima; Norio Yabe, all of Higashimatsuyama, Japan

[73] Assignee: Nippon Paper Industries Co., Ltd., Tokyo, Japan

[21] Appl. No.: 924,918

[22] Filed: Sep. 8, 1997

[30] Foreign Application Priority Data

Sep. 24, 1996 [JP] Japan ................... 8-273057

[51] Int. Cl.$^6$ .............. B41F 31/00; G03C 1/805
[52] U.S. Cl. ............ 101/483; 430/143; 430/256; 430/293; 430/271.1; 430/950
[58] Field of Search ............. 101/483, 487, 101/492; 430/143, 256, 257, 258, 259, 260, 261, 262, 263, 271.1, 293, 950

[56] References Cited

U.S. PATENT DOCUMENTS

| | | |
|---|---|---|
| 3,962,009 | 6/1976 | Minami et al. ............ 101/491 |
| 4,427,761 | 1/1984 | Charles . |
| 4,579,810 | 4/1986 | Johnson et al. . |
| 4,999,266 | 3/1991 | Platzer et al. . |
| 5,019,471 | 5/1991 | Mino et al. . |
| 5,019,536 | 5/1991 | Taylor, Jr. . |
| 5,059,509 | 10/1991 | Mino et al. . |
| 5,085,969 | 2/1992 | Namiki et al. . |
| 5,240,810 | 8/1993 | Barjesten . |
| 5,387,491 | 2/1995 | Takada et al. . |
| 5,529,879 | 6/1996 | Hoshino et al. . |
| 5,667,935 | 9/1997 | Hou . |
| 5,705,314 | 7/1998 | Kapusniak et al. . |

FOREIGN PATENT DOCUMENTS

| | | |
|---|---|---|
| A 60-28649 | 2/1985 | Japan . |
| A 61-286857 | 12/1986 | Japan . |
| A 62-103636 | 5/1987 | Japan . |

*Primary Examiner*—Eugene H. Eickholt
*Attorney, Agent, or Firm*—Oblon, Spivak, McClelland, Maier & Neustadt, P.C.

[57] ABSTRACT

Disclosed is a varnishing film and a method of adjusting the surface gloss of prepress color proof using the same for obtaining a color proof with the surface gloss in the particular areas of image adjusted, comprising the step of forming an image on matt surface having been formed using the varnishing film with an adhesive transparent resin layer and a photosensitive layer containing transparent matting agent provided on a transparent supporter, on the prepress color proof formed by Surprint process. It is possible to form an image with difference in the surface glosses on the prepress color proof formed by Surprint process.

11 Claims, 3 Drawing Sheets

VARNISHING FILM AND METHOD OF ADJUSTING THE SURFACE GLOSS OF PREPRESS COLOR PROOF USING THE SAME

BACKGROUND OF THE INVENTION

The present invention relates to a varnishing film to be used for adjusting the surface gloss of prepress color proof. In more detail, it relates to a varnishing film to be used for forming an image with different glosses in particular areas on the surface of Surprint mode prepress color proof that is used mainly for proofreading operation during printing plate-making process, and a method of adjusting the surface gloss of prepress color proof using the same.

So far, there has been a method of forming a pattern on the surface of prints with resin, resin containing matting agent, etc. (overprint varnishing) to alter the surface gloss in that treated area, thus enhancing the printing effect, to raise the surface strength and to prevent the blocking (Printing Ink Technology, 413–417, written by E. A. Apps, Leonard Hill Limited, 1961).

On the other hand, so far, for color printing plate-making and proofreading of color printing, the prepress color proof by Surprint process using photosensitive transfer sheet that utilizes photosensitive resin etc. has been used (Japanese Unexamined Patent Publication Nos. Sho 60-28649, Sho 61-286857, Sho 62-103636, etc.).

Conventionally, however, there has been no method of performing a treatment equal to the overprint varnishing onto said prepress color proof by Surprint process. The invention relates to a method to give an equal effect to overprint varnishing used on printing to prepress color proof by Surprint process, in particular, addresses a subject to provide a method of altering the gloss in particular areas of image formed on the prepress color proof by Surprint process, thus enhancing the expression effect of prints.

As a result of diligent investigations to solve the subject aforementioned, the inventors have developed a varnishing film characterized by comprising an adhesive transparent resin layer and a photosensitive layer containing transparent matting agent layered on a transparent supporter. With such constitution, when the inventive varnishing film is imagingwise exposed to light and developed, the photosensitive layer containing transparent matting agent remains in the exposed areas to produce low-gloss image, and the photosensitive layer is removed in the nonexposed areas to expose the adhesive transparent resin layer with high gloss, resulting in high gloss. Consequently, the difference in glosses between exposed areas and nonexposed areas becomes significant, leading to an image excellent in the contrast.

SUMMARY OF THE INVENTION

As a method of adjusting the surface gloss of prepress color proof, wherein a low-gloss image is formed on a photosensitive layer of varnishing film with an adhesive transparent resin layer and the photosensitive layer layered on a transparent supporter through imagingwise light-exposure and development, said low-gloss image is transferred onto an image-receiving sheet with an adhesive transparent resin layer provided on a supporter, together with the adhesive transparent resin layer thereof under heat and pressure, and the transparent supporter thereof is peeled off, one separate image is formed on a photosensitive layer by imagingwise exposing to light and developing a photosensitive transfer sheet with an adhesive transparent resin layer peelable off from transparent supporter and the photosensitive layer containing coloring agent layered on other transparent supporter, then superposed on the image-receiving sheet having transferred said low-gloss image, transferred under heat and pressure and the transparent supporter is peeled off, similarly, other separate color image is prepared by similarly imagingwise exposing to light and developing other photosensitive transfer sheet with a photosensitive layer containing coloring agent different in color tone, then transferred under heat and pressure and the transparent supporter is peeled off, which is repeated by the number of colors required for transfer, and thereafter the transferred surface of this image-receiving sheet is superposed on a final supporter, transferred under heat and pressure and the image-receiving sheet is peeled off, thereby forming a color image on the final supporter, the invention addressed a subject to provide a method of using a varnishing film with an adhesive transparent resin layer peelable off from supporter and a photosensitive layer containing transparent matting agent layered on a transparent supporter, thereby affording the same effect as with the overprint varnishing treatment onto the prepress color proof with color image formed on the final supporter.

The inventive method of performing the treatment equal to overprint varnishing on the prepress color proof by Surprint process forms a low-gloss image having been formed on the varnishing film, on the top surface of final supporter by treating:

1) a step of forming a low-gloss image on a photosensitive layer of varnishing film with an adhesive transparent resin layer and the photosensitive layer containing transparent matting agent layered on a transparent supporter through imagingwise light-exposure and development, 2) a step of transferring said low-gloss image onto an image-receiving sheet with an adhesive transparent resin layer provided on a supporter, together with adhesive transparent resin layer under heat and pressure, and peeling off the transparent supporter, 3) a step of forming a color image on a photosensitive layer by imagingwise exposing to light and developing a photosensitive transfer sheet with an adhesive transparent resin layer peelable off from transparent supporter and the photosensitive layer containing coloring agent layered on other transparent supporter, 4) a step of superposing the surface of photosensitive layer of photosensitive transfer sheet on the surface of adhesive transparent resin layer of image-receiving sheet having transferred the low-gloss image formed on the photosensitive layer of varnishing film after said step 2), transferring under heat and pressure, and then peeling off the transparent supporter, 5) a step of repeating imagingwise light-exposure, development, transfer and peeling-off of transparent supporter by the number of colors required similarly, with other photosensitive transfer sheets with photosensitive layers containing coloring agents different in color tones, similarly to the step 4) aforementioned, and 6) a step of superposing the transferred surface of said image-receiving sheet on a final supporter, transferring the image under heat and pressure, and then peeling off the image-receiving sheet.

DETAILED DESCRIPTION OF THE INVENTION

Figure 1:
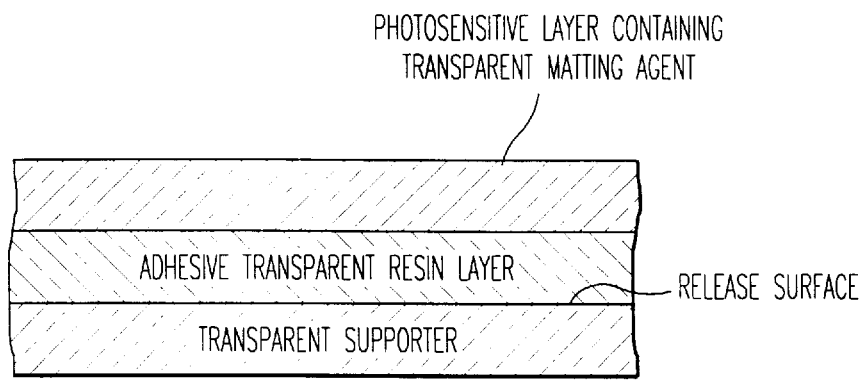
FIG. 1 is a sectional view of the vanishing film of the invention.

Here, the varnishing film to be used in the invention has the adhesive transparent resin layer and the photosensitive layer containing transparent matting agent formed on the transparent supporter provided with a release layer, if need be, as shown in FIG. 1.

As the transparent supporters of said varnishing film to be used in the invention, transparent plastic films such as poly(ethylene terephthalate), polypropylene, polyethylene, polystyrene, poly(vinyl chloride), polycarbonate, triacetate and poly(ethylene naphthalate) can be mentioned. In particular, biaxially stretched plastic film is preferable, and poly(ethylene terephthalate) film is excellent in the strength, heat resistance, dimensional stability, transparency, economic aspect, etc., which is preferable. The thickness of this transparent supporter is not particularly restricted, but is suitable to be around 50 to 150 $\mu$m.

Between the transparent supporter and the adhesive transparent resin layer of the varnishing film to be used in the invention, a release layer that is afforded, if need be, may be provided. This release layer is for making peeling-off of the adhesive transparent resin layer from the transparent supporter easy, and the material for forming release layer is desirable to have a peeling force from the adhesive transparent resin layer ranging from 1.0 to 10.0 g/25 mm, more preferably, to be peeled off within a range from 2.0 to 4.5 g/25 mm. As the resins liable to give the peeling force of this range, urethane resin, melamine resin, silicone resin, copolymers or mixtures therewith and the like are mentioned. Moreover, it is also possible to adjust the peeling force or surface smoothness by adding inorganic pigments such as silica (silicon dioxide), plastic pigments, etc. to this release layer. The coating weight of release layer is not particularly restricted, but is desirable to be selected within a range of dry weight from 0.5 to 5.0 g/m$^2$.

The adhesive transparent resin layer of the varnishing film to be used in the invention is required to sufficiently adhere to the image formed thereon, to be easily peelable off from the transparent supporter with release layer provided, if need be, to sufficiently adhere to the image and the adhesive transparent resin layer thereof to be transferred onto other during transfer operation under heat and pressure, and to have adequate adhesiveness also to the adhesive transparent resin layer of image-receiving sheet. As a resin meeting such objectives, utilization of pressure-sensitive adhesive or thermosensitive adhesive is preferable, and, though not particularly restricted, the thermosensitive adhesive is more preferable from the point of operativities such as registering. Concretely, film-forming high-molecular substances as follows can be mentioned.

Polyacrylic ester and acrylic ester copolymers, polymethacrylic ester and methacrylic ester copolymers, polyacrylamide and acrylamide copolymers, poly(vinyl acetate) and vinyl acetate copolymers, poly(vinyl chloride) and vinyl chloride copolymers, poly(vinylidene chloride) and vinylidene chloride copolymers, polystyrene and styrene copolymers, ethylene copolymers such as ethylene with vinyl acetate, ethylene with acrylic ester, ethylene with vinyl chloride and ethylene with acrylic acid, poly(vinyl acetal) resins such as poly(vinyl butyral) and poly(vinyl formal), polyester resins, polyamide resins such as nylon and copolymerized nylon, various rubbers such as synthetic rubber and chlorinated rubber, polyolefins such as polyethylene and polypropylene, cellulose derivatives, shellac, and various waxes.

In addition, it is also possible to use mutual blends of these high-molecular substances or mixed systems with other materials such as other high-molecular substances, plasticizers and supercooling substances. Thereamong, ethylene-vinyl acetate copolymer, polyolefin, polyester, etc. are more effective. Further, more preferably, polyester can be mentioned from the points of adhesiveness to image, stability of transfer, transparency, etc.

The coating weight of adhesive transparent resin layer is not particularly restricted, but it is desirable to be selected within a range from 0.2 to 5.0 g/m$^2$ by dry weight.

The photosensitive layer containing transparent matting agent of varnishing film to be used in the invention causes a photochemical reaction mainly with transparent matting agent and by actinic rays and comprises photosensitive composition that forms the image by developing treatment thereafter.

As the transparent matting agents to be added to the photosensitive layer of varnishing film of the invention, inorganic pigments such as silicon dioxide and calcium carbonate, polymers or copolymers of urethane, acrylic, styrene, methacrylic ester, etc., organic pigments of finely pulverized fluoro resin, silicone resin, etc., glass powder, and the like are mentioned, but they are not particularly restricted to these transparent matting agents. The average particle diameter of transparent matting agent used is suitable to be not larger than 10 $\mu$m, more-preferably not larger than 5 $\mu$m. These transparent matting agents can be utilized as simple materials or mixtures of several kinds.

For the photosensitive composition that causes the photochemical reaction by actinic rays and forms the image by developing treatment thereafter, traditionally known photosensitive resin can be utilized, and such one that is excellent in the miscibility with transparent matting agent and the dispersibility, that forms the image exhibiting good adhesiveness to said adhesive transparent resin layer and good image characteristics, that shows less coloring in the image formed, and that is excellent in the transparency is selected. As the examples of these, followings can be mentioned.

1. Compositions comprising water-soluble resins such as gelatin, fish glue, arabic gum and poly(vinyl alcohol) and ammonium bichromate, potassium bichromate or ammonium chromate, 2. Compositions comprising photosensitive ferric compounds such as ferric ammonium citrate and ferric ammonium oxalate that give ferrous ions through exposure to light and water-soluble resins such as gelatin, 3. Compositions comprising water-soluble resins such as gelatin, fish glue, arabic gum, poly(vinyl alcohol), polyacrylamide, carboxymethylcellulose and hydroxyethylcellulose and tetrazonium salt of diamino compounds such as p-aminodiphenylamine (benzidine),dianisidine and tolidine or diazo resin of p-diazodiphenylamine condensed with paraformaldehyde, 4. Compositions comprising diazo resins of diazo compounds such as p-diazodiphenylamine condensed with paraformaldehyde, 5. Compositions comprising azide compounds such as sodium 4,4'-diazidostilbene-2,2'-disulfonate and water-soluble resins such as polyacrylamide, poly(vinyl alcohol), poly(vinyl pyrrolidone and gelatin, 6. Compositions comprising azide compounds such as 4,4'-diazidostilbene and 4,4'-diazidocalcon and cyclized rubber, 7. Compositions comprising quinonediazide compounds such as naphthoquinone-(1,2)-diazidosulfonic ester and alkali-soluble phenol-formaldehyde resin, 8. Compositions comprising polymers such as cinnamic ester of poly(vinyl alcohol) with cinnamic acid group introduced into molecule and sensitizers such as nitroacenaphthene, 1,2-benzanthraquinone and Michler ketone, and 9. Modified poly(vinyl alcohol) compositions with photosensitive groups such as stilbinilium group, stilbazolium group and stilquinolium group added to poly(vinyl alcohol).

The % ratio by solids weight of this photosensitive composition to transparent matting agent in said photosensitive layer is adjusted according to the request of surface gloss, but it comes to differ depending on the thickness of said photosensitive layer, type of pigment used, in particular, particle diameter, specific gravity, etc. Usually, the surface gloss is requested to be not higher than 70% and more often not higher than 50% (75° surface gloss according to JIS-Z-8741), and, within a range capable of obtaining this surface gloss and satisfiable quality of image to be formed from photosensitive layer, a ratio of 50:50 to 98:2 is usually selected for said photosensitive composition and transparent matting agent.

The coating weight of the photosensitive layer containing transparent matting agent is desirable to be selected within a range from 0.5 to 10.0 g/m² by dry weight, though not particularly restricted.

Moreover, to the release layer, adhesive transparent resin layer and photosensitive layer containing transparent matting agent aforementioned, it is preferable to add additives such as leveling agent and antifoamer that improve the coatability, respectively, if need be. Furthermore, with respect to the coating of each layer, a coating method that gives higher uniformity is desirable, but the coating method is not particularly restricted.

Besides, for the light-exposure of varnishing film to be used in the invention, ultraviolet ray light sources such as xenon arc lamp, carbon arc lamp and ultra high-pressure mercury-vapor lamp are used, and imagingwise light-exposure is usually conducted in an environment closely contacted with manuscript under vacuum.

Moreover, for the development of varnishing film to be used in the invention after exposure to light, developing solution is selected from tap water, alkaline aqueous solution, organic solvents, etc., matching the type of said photosensitive composition to be used for photosensitive layer.

Figure 2:
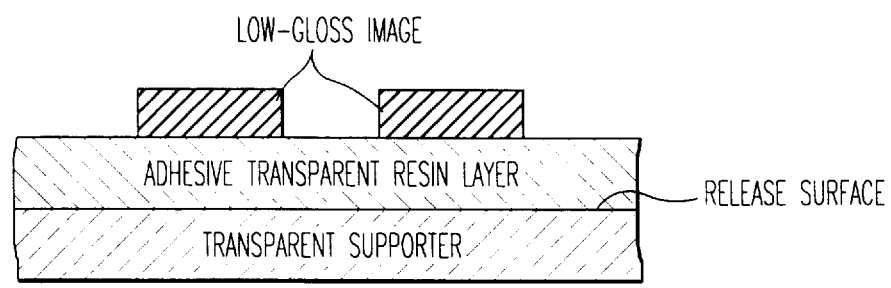
FIG. 2 is a sectional view of varnishing film with the image formed through light-exposure and development.
Figure 4:
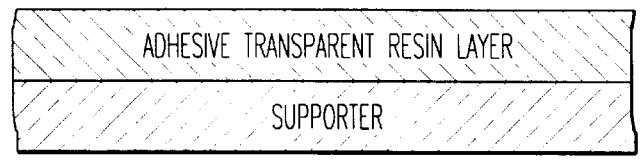
FIG. 4 is a sectional view of image-receiving sheet.
Figure 5:
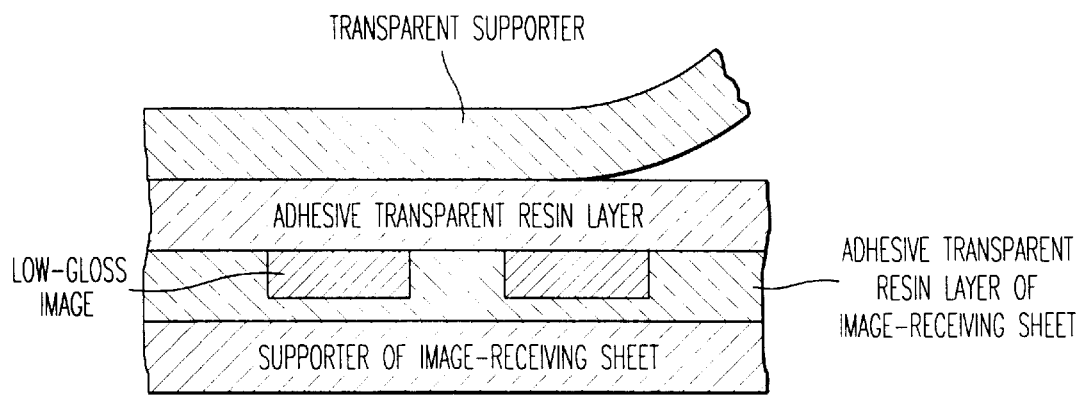
FIG. 5 is an illustration diagram showing the step of transferring the low-gloss image and the adhesive transparent resin layer of the varnishing film onto the image-receiving sheet, and peeling off the transparent supporter thereof.

The varnishing film to be used in the-invention provides the low-gloss image through imagingwise light-exposure and development as shown in FIG. 2, since the photosensitive layer contains transparent matting agent, which is transferred onto an image-receiving sheet with constitution shown in FIG. 4 under heat and pressure, as shown in FIG. 5, after said imagingwise light-exposure and development. Upon this transfer, it is preferable to pass through two rotating rolls having the surface of silicone rubber or the like and being heated and pressurized. At this time, the surface temperature of roll is preferable to be 100° C. or lower from the thermal stability of transparent supporter.

Figure 3:
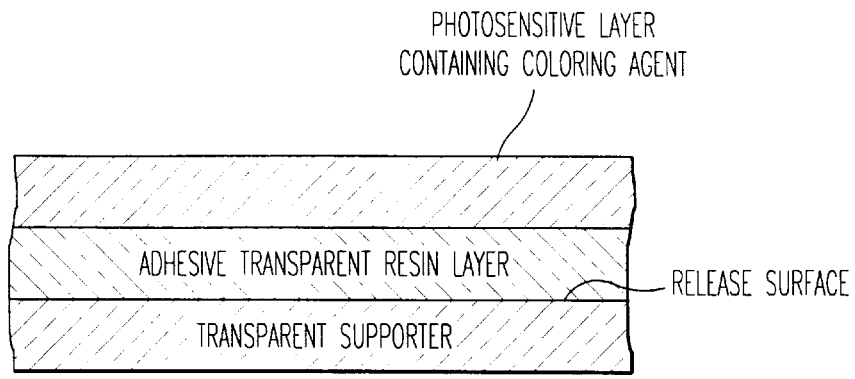
FIG. 3 is a sectional view of photosensitive transfer sheet.

Besides, the photosensitive transfer sheet with an adhesive transparent resin layer peelable off from transparent supporter and a photosensitive layer containing coloring agent layered on a transparent supporter in the invention, as shown in FIG. 3, also has no particular restriction, but, for the transparent supporter, release layer, adhesive transparent resin layer and photosensitive composition in the photosensitive layer, those same as for said varnishing film can be used. Moreover, as the coloring agents in the photosensitive layer, those that show the same color tones as printing inks used usually in printing process are utilized and, in general, pigments and dyes coinciding with yellow magenta, cyan and black are used.

As the examples, coloring pigments such as Benzidine Yellow, Fast Yellow, Permanent Yellow HR, Lake Red C, Carmine 6B, Permanent Carmine FB, Watch Unbled, Pordamine Lake B, Phthalocyanine Blue, Fast Sky Blue, carbon-black and their mixtures, oil-soluble dyes such as Oil Yellow 5G, Oil Yellow 3G, Oil Red G, Oil Red HRR, Oil Red 5B, Oil Black HB, Zapon Fast Black RE, Zapon Fast Black B, Zapon Fast Blue ELE, Zapon Fast Red BE, Zapon Fast Red B, Zapon Fast Red GE, Zapon Fast Yellow G, Zapon Fast Yellow GR and their mixtures, water-soluble dyes such as Direct Fast Yellow GC, Tartrazine, Rose Bengal, Safranine T. Rhodamine B, Congo Red, Direct Fast Sky Red 4BS, Methylene Blue, Soluble Blue Direct, Sky Blue 5B, Acid Cyanine 6B, Victoria Blue B, nigrosine and their mixtures, and the like can be mentioned, but, additionally, it is also possible to arbitrarily select colors such as blue, red and green requested specially.

Figure 6:
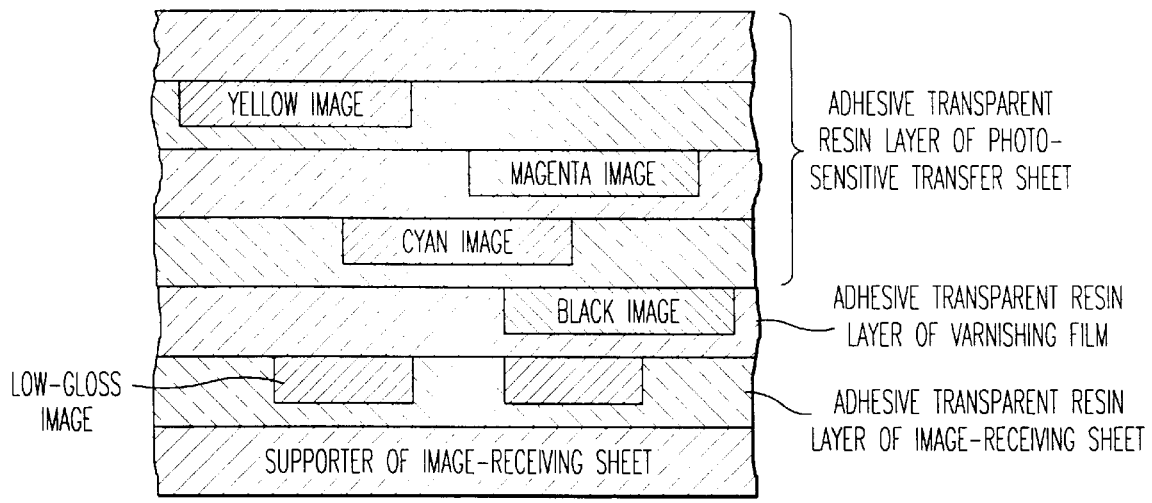
FIG. 6 is a sectional view showing the step of transferring the color images and the adhesive transparent resin layers of 4-color photosensitive transfer sheets onto the image-receiving sheet one after another, and peeling off the transparent supporters thereof.
Figure 7:
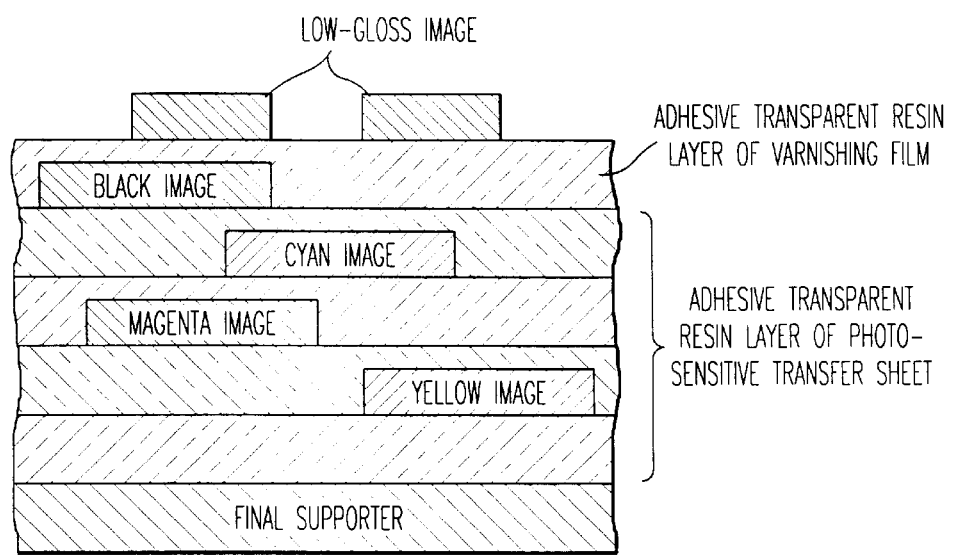
FIG. 7 is a sectional view of color proof with the surface gloss in particular areas of image adjusted, obtainable by transferring the color image and the adhesive transparent resin layer of image-receiving sheet onto the final supporter, and peeling off the transparent supporter of image-receiving sheet.

Next, with respect to the image-receiving sheet to be used in the invention shown in FIG. 4, usually, a layer comprising an adhesive transparent resin that softens by heat on transfer operation under heat and pressure to exhibit the adhesiveness is provided on a transparent supporter. It is required for this adhesive transparent resin layer that softens by heat to temporarily adhere to the image formed on said varnishing film and the adhesive transparent resin layer coated onto varnishing film on transfer operation as shown in FIG. 5, to transfer multicolor color images in FIG. 6, and, thereafter, to allow to peel off both the image formed on the varnishing film and the adhesive transparent resin layer coated onto varnishing film at the step of having transferred onto the final supporter as shown in FIG. 7. As the materials for the adhesive transparent resin layer capable of achieving these objectives, polyethylene, ethylene-vinyl acetate copolymer, ethylene-methacrylic acid copolymer, ethylene-ethyl acrylate copolymer, ionomer resin, etc. can be used solely or in combination. The coating weight of this adhesive transparent resin layer is preferable to be not less than 15 g/m² by dry weight in order to sufficiently adhere to the image formed on said varnishing film having uneven surface on transfer. Moreover, as the transparent supporter thereof, same one as mentioned for said varnishing film can be used.

Besides, as the final supporters to be used in the invention, usually, papers such as coated paper and fine paper used for printing are used, but, additionally, utilization of various plastic films, glass plate, cloth, plastic plate, etc. is possible, which is not particularly restricted.

In following, the examples will be shown, but the invention is not confined to these.

EXAMPLE 1

[Varnishing Film]

Onto a 100 μm thick biaxially stretched poly(ethylene terephthalate) film,
(release layer liquor)
a release layer liquor comprising:
melamine, acrylic copolymer (Tesfine 322: Hitachi Chemical Polymer Co., Ltd.) (40% solution) 10 parts
saturated polyester (Thermolack F1: Soken Kagaku Co., Ltd.) (30% solution) 30 parts
vinyl chloride, vinyl propionate copolymer (Reulon Qu-628: Tosoh Corp.) (40% solution) 20 parts
silica (Mizukasil SK-7: Mizusawa Industrial Chemicals Ltd.) 5 parts
toluene 220 parts
methyl ethyl ketone 120 parts
cyclohexanone 60 parts
was coated using wire bar and dried for 1 minute at a temperature of 130° C. to obtain a release layer with dry weight of 2 g/m$^2$.

Further, thereonto,
(adhesive transparent resin layer liquor)
an adhesive transparent resin layer liquor comprising:
Polyester (Byronal MA-14: Toyobo Co., Ltd.) (30% solution) 20 parts
isopropyl alcohol 40 parts
water 40 parts
was coated using wire bar and dried for 1 minute at a temperature of 120° C. to obtain an adhesive transparent resin layer with dry weight of 1 g/m$^2$.

Further, thereonto, (liquor for photosensitive layer containing transparent matting agent) a liquor for photosensitive layer containing transparent matting agent comprising:
SBQ modified PVA (15% aqueous solution) 100 parts
(introduction rate of stilbazolium group: 1.5 mol %, average polymerization degree: 1100, saponification degree: 80) silica (Mizukasil SK-7: Mizusawa Industrial Chemicals Ltd.) 2.5 parts
water 100 parts
isopropyl alcohol 10 parts
was coated using wire bar and dried for 1 minute at a temperature of 100° C. to provide a photosensitive layer with dry weight of 2.2 g/m$^2$, thus obtaining a varnishing film.

[Photosensitive transfer sheet]

Onto a 100 μm thick biaxially stretched poly(ethylene terephthalate) film, the release layer liquor and the adhesive transparent resin liquor of said varnishing film were coated similarly to form a release layer and an adhesive transparent resin layer, and then, (photosensitive layer liquor containing coloring agent) photosensitive layer liquors containing each coloring agent of four colors in Table 1 were coated with wire bar, respectively, and dried for 1 minute at a temperature of 100° C. to obtain four photosensitive transfer sheets of yellow, magenta, cyan and black with photosensitive layers each containing each coloring agent by dry weight listed in Table 1.

[Image-receiving sheet]

Onto a 100 μm thick biaxially stretched poly(ethylene terephthalate) film,
(primer layer liquor)
a primer layer liquor comprising:
acrylic polyol (Thermolack U-2450: Soken Kagaku Co., Ltd.) (50% solution) 45 parts
isocyanate (Takenate D-110N: Takeda Chemical Industries, Ltd.)
(75% solution) 20 parts
silica (Mizukasil SK-7: Mizusawa Industrial Chemicals Ltd.) 5 parts
toluene 100 parts
ethyl acetate 100 parts
ethyl cellosolve 50 parts
was coated using wire bar and dried for 1 minute at a temperature of 120° C. to obtain a primer layer with dry weight of 2.0 g/m$^2$.

Further, thereonto, (adhesive transparent resin layer liquor for image-receiving sheet) an adhesive transparent resin layer liquor for image-receiving sheet comprising:
ionomer resin (Chemipearl S-100: Mitsui Petrochemical Industries, Ltd.) (25% solution) 50 parts
olefin resin (Chemipearl W-200: Mitsui Petrochemical Industries, Ltd.) (40% solution) 35 parts
water 30 parts
methanol 30 parts
was coated using wire bar and dried for 3 minutes at a temperature of 100° C. to provide an adhesive transparent resin layer of image-receiving sheet with dry weight of 20.0 g/m$^2$, thus obtaining an image-receiving sheet.

Using varnishing film, 4-color photosensitive transfer sheets and image-receiving sheet thus obtained;

1. The varnishing film was superposed on the manuscript, exposed to light for 40 seconds at a distance of 1 m with 3 KW ultra high-pressure mercury-vapor lamp, closely contacting under vacuum, and developed using a sponge while pouring tap water to form a low-gloss image in exposed-areas. This image surface of varnishing film with image formed was superposed on the surface of adhesive transparent resin layer of image-receiving sheet, passed through rolls having surface of silicone rubber heated to 110° C. and pressurized, and then the transparent supporter of varnishing film was peeled off together with the release layer thereof.

2. Each 4-color photosensitive transfer sheet was superposed on the separate color manuscript corresponding to each color, and imagingwise exposed to light and developed under the same exposure and development conditions as those for said varnishing film, however changing only the exposure times to 40 seconds for yellow, 30 seconds for magenta, 30 seconds for cyan and 60 seconds for black to form each image of yellow, magenta, cyan and black. Following this, the black image was superposed on the image-receiving sheet having transferred the image formed on the varnishing film, transferred under heat and pressure in the same conditions as for said varnishing film, and the transparent supporter was peeled off together with the release layer thereof.

Further, similar transfers thereonto in order of cyan, magenta and yellow and peelings-off of the transparent supporters thereof were repeated.

3. Thereafter, the transferred surface of this image-receiving sheet was superposed on a A2 grade coated paper, transferred under heat and pressure in the same conditions as for said varnishing film, and the image-receiving sheet was peeled off, thereby obtaining a color proof with the low-gloss image having been formed on the varnishing-film, formed on the top surface of coated paper.

The surface glosses of this color proof were 50% in the areas where the low-gloss image having been formed on the varnishing film was on the surface and 80% in the areas where the low-gloss image had not been formed on the varnishing film and the adhesive transparent resin layer appeared on the surface, resulting in the difference in surface glosses of 30%.

TABLE 1

|  | Yellow | Magenta | Cyan | Black |
|---|---|---|---|---|
| SBQ modified PVA (15% aq. solution) | 100 parts | 100 parts | 100 parts | 100 parts |
| Introduction rate of stilbazolium group (mol %) | 2.0 | 1.5 | 1.5 | 3.0 |
| Av. polymerization degree | 1100 | 1100 | 1100 | 1100 |
| Saponification degree | 80 | 80 | 80 | 80 |
| Pigment dispersion(20% soln.) | 5 parts | 5 parts | 5 parts | 5 parts |
| Pigment | Permanent Yellow HR | Permanent Carmine FB | Phthalocyanine Blue | Carbon black |
| Water | 100 parts | 100 parts | 100 parts | 100 parts |
| Isopropyl alcohol | 10 parts | 10 parts | 10 parts | 10 parts |
| Dry weight (g/m$^2$) | 1.7 | 1.5 | 1.8 | 2.0 |

EXAMPLE 2

Only the liquor for photosensitive layer containing transparent matting agent of the varnishing film was varied as follows in Example 1, and, for other conditions, all the same materials and conditions as in Example 1 were used.
(Liquor for photosensitive layer containing transparent matting agent)
a liquor for photosensitive layer containing transparent matting agent comprising:
  SBQ modified PVA (15% aqueous solution) 100 parts (introduction rate of stilbazolium group: 1.5 mol %, average polymerization degree: 1100, saponification degree: 80)
  silica (Aerosil-R972: Japan Aerosil Co., Ltd.) 3.5 parts
  Water 100 parts
  isopropyl alcohol 10 parts
was coated onto the transparent supporter using wire bar and dried for 1 minute at a temperature of 100° C. to provide a photosensitive layer containing transparent matting agent with dry weight of 2.5 g/m$^2$, thus obtaining a varnishing film.

The surface glosses of color proof thus obtained were 35% in the areas where the low-gloss image having been formed on the varnishing film was on the surface and 75% in the areas where the low-gloss image had not been formed on the varnishing film and the adhesive transparent resin layer appeared on the surface, resulting in the difference in surface glosses of 40%.

EXAMPLE 3

Only the liquor for photosensitive layer containing transparent matting agent of the varnishing film was varied as follows in Example 1, and, for other conditions, all the same materials and conditions as in Example 1 were used.
(Liquor for photosensitive layer containing transparent matting agent)
a liquor for photosensitive layer containing transparent matting agent comprising:
  SBQ modified PVA (15% aqueous solution) 100 parts (introduction rate of stilbazolium group: 1.5 mol %, average polymerization degree: 1100, saponification degree: 80) plastic pigment: melamine-formaldehyde condensate (Epostar-S:
  Nippon Shokubai Kagaku Kogyo Co., Ltd.) 7.0 parts
  water 100 parts
  isopropyl alcohol 10 parts
was coated on the transparent supporter using wire bar and dried for 1 minute at a temperature of 10° C. to provide a photosensitive layer containing transparent matting agent with dry weight of 1.5 g/m$^2$, thus obtaining a varnishing film.

The surface glosses of color proof thus obtained were 45% in the areas where the low-gloss image having been formed on the varnishing film was on the surface and 87% in the areas where the low-gloss image had not been formed on the varnishing film and the adhesive transparent resin layer appeared on the surface, resulting in the difference in surface glosses of 42%.

COMPARATIVE EXAMPLE 1

Using the 4-color photosensitive transfer sheets and the image-receiving sheet in Example 1;

1. Each 4-color photosensitive transfer sheet was superposed on the separate color manuscript corresponding to each color, imagingwise exposed to light at a distance of 1 m with 3 KW ultra high-pressure mercury-vapor lamp, closely contacting under vacuum and making the exposure times 40 seconds for yellow, 30 seconds for magenta, 30 seconds for cyan and 60 seconds for black, and developed using a sponge while pouring tap water to form respective images of yellow, magenta, cyan and black.

2. The black image was superposed on the image-receiving sheet, passed through rolls having surface of silicone rubber heated to 110° C. and pressurized, and then the transparent supporter was peeled off together with release layer. Further, similar transfers thereonto in order of cyan, magenta and yellow and peelings-off of the transparent supporters were repeated.

3. Thereafter, the transferred surface of this image-receiving sheet was superposed on a A2 grade coated paper, transferred under heat and pressure in the same conditions, and the image-receiving sheet was peeled off, thereby obtaining a color proof on coated paper.

The surface glosses of this color proof were 75% in the areas where yellow color image appeared on the surface and 85% in the areas where the adhesive transparent resin layer appeared on the surface, but the difference in the expressions of image due to partial difference of surface glosses could not be seen at all.

What is claimed is:

1. A varnishing film in the method of adjusting the surface gloss of prepress color proof to obtain an image with surface gloss adjusted through the treatments of:
  1) a step of forming an image on a photosensitive layer of varnishing film with the photosensitive layer layered via an adhesive transparent resin layer on a transparent supporter through imagingwise light-exposure and development,
  2) a step of transferring the image of varnishing film after said step 1) onto an image-receiving sheet with the adhesive transparent resin layer provided on a supporter, together with adhesive transparent resin layer under heat and pressure, and peeling off the transparent supporter thereof, 3) a step of forming a color image on a photosensitive layer by imagingwise exposing to light and developing a photosensitive transfer sheet with an adhesive transparent resin layer peelable off from transparent supporter and the photosensitive layer containing coloring agent layered on other transparent supporter, 4) a step of superposing the surface of photosensitive layer of photosensitive transfer sheet after the step 3) on the surface of adhesive transparent resin layer of image-receiving sheet having transferred the image formed on the photosensitive layer of said varnishing film, transferring under heat and pressure, and then peeling off the transparent supporter, 5) a step of repeating imagingwise light-exposure, development, transfer and peeling-off of transparent supporter by the number of colors required, similarly, with other photosensitive transfer sheets with photosensitive layers containing coloring agents different in color tones, similarly to the step 4) aforementioned, and 6) a step of superposing the transferred surface of said image-receiving sheet on a final supporter, transferring the image under heat and pressure, and then peeling off the imagereceiving sheet, the improvements comprising the adhesive transparent resin layer of said varnishing film being peelable off from the transparent supporter and the photosensitive layer of said varnishing film containing transparent matting agent, thereby, causing the image having been formed on the photosensitive layer of varnishing film to provide a low-gloss image on the top surface of final supporter.

2. The varnishing film of claim 1, wherein the transparent matting agent contained in the photosensitive layer of said varnishing film is a transparent pigment.

3. The varnishing film of claim 1, wherein the transparent matting agent contained in the photosensitive layer of said varnishing film is a plastic pigment.

4. The varnishing film of claim 1, wherein the transparent matting agent contained in the photosensitive layer of said varnishing film is silicon dioxide.

5. The varnishing film of any of claims 1 through 4, wherein the transparent supporter of said varnishing film is a biaxially stretched poly(ethylene terephthalate) film.

6. The varnishing film of claim 1, wherein the peelable adhesive transparent resin layer and the photosensitive layer containing transparent matting agent are layered via a release layer on one side of the transparent supporter of said varnishing film.

7. The varnishing film of claim 1, wherein the surface gloss of the image formed on the photosensitive layer containing transparent matting agent of said varnishing film is not higher than 50%.

8. The varnishing film of claim 6, wherein the surface gloss of the image formed on the photosensitive layer containing transparent matting agent of said varnishing film is not higher than 50%.

9. The varnishing film of claim 5, wherein the peelable adhesive transparent resin layer and the photosensitive layer containing transparent matting agent are layered via a release layer on one side of the transparent supporter of said varnishing film.

10. The varnishing film of claim 5, wherein the surface gloss of the image formed on the photosensitive layer containing transparent matting agent of said varnishing film is not higher than 50%.

11. A method of adjusting the surface gloss of prepress color proof to obtain an image with surface gloss adjusted through the treatments of:

1) a step of forming a low-gloss image on a photosensitive layer of varnishing film with the photosensitive layer layered via an adhesive transparent resin layer on a transparent supporter through imagingwise light-exposure and development, 2) a step of transferring the image of varnishing film after said step 1) onto an image-receiving sheet with the adhesive transparent resin layer provided on a supporter, together with adhesive transparent resin layer under heat and pressure, and peeling off the transparent supporter thereof, 3) a step of forming a color image on a photosensitive layer by imagingwise exposing to light and developing a photosensitive transfer sheet with an adhesive transparent resin layer peelable off from transparent supporter and the photosensitive layer containing coloring agent layered on other transparent supporter, 4) a step of superposing the surface of photosensitive layer of photosensitive transfer sheet after the step 3) on the surface of adhesive transparent resin layer of image-receiving sheet having transferred the image formed on the photosensitive layer of said varnishing film, transferring under heat and pressure, and then peeling off the transparent supporter, 5) a step of repeating imagingwise light-exposure, development, transfer and peeling-off of transparent supporter by the number of colors required similarly, with other photosensitive transfer sheets with photosensitive layers containing coloring agents different in color tones, similarly to the step 4) aforementioned, and 6) a step of superposing the transferred surface of said image-receiving sheet on a final supporter, transferring the image under heat and pressure, and then peeling off the image-receiving sheet, the improvements comprising the adhesive, transparent resin layer of said varnishing film being peelable off from the transparent supporter thereof and the photosensitive layer of said varnishing film containing transparent matting agent, thereby causing the image having been formed on the photosensitive layer of varnishing film to provide a low-gloss image on the top surface of final supporter.

* * * * *